(12) United States Patent
Lee et al.

(10) Patent No.: US 12,363,459 B2
(45) Date of Patent: Jul. 15, 2025

(54) PHOTOSENSING PIXEL INCLUDING SELF-ALIGNED LIGHT SHIELDING LAYER

(71) Applicant: TAIWAN SEMICONDUCTOR MANUFACTURING COMPANY, LTD., Hsinchu (TW)

(72) Inventors: Yueh-Chuan Lee, Hsinchu (TW); Chih-Chiang Chang, Hsinchu (TW); Chia-Chan Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 490 days.

(21) Appl. No.: 17/739,387

(22) Filed: May 9, 2022

(65) Prior Publication Data

US 2023/0362515 A1 Nov. 9, 2023

(51) Int. Cl.
*H04N 25/771* (2023.01)
*H04N 25/53* (2023.01)
*H10F 39/00* (2025.01)

(52) U.S. Cl.
CPC ........... *H04N 25/771* (2023.01); *H04N 25/53* (2023.01); *H10F 39/024* (2025.01); *H10F 39/803* (2025.01); *H10F 39/8057* (2025.01)

(58) Field of Classification Search
CPC ............ H04N 25/771; H01L 27/14623; H01L 27/14609; H01L 27/14685
See application file for complete search history.

(56) References Cited

U.S. PATENT DOCUMENTS

2021/0098516 A1\* 4/2021 Chen ................. H01L 27/14603

\* cited by examiner

*Primary Examiner* — Sarah K Salerno
(74) *Attorney, Agent, or Firm* — Birch, Stewart, Kolasch & Birch, LLP

(57) ABSTRACT

A method is provided for forming a light-shielding layer to block irradiation of light onto a light-sensitive storage region. The light-sensitive storage region is formed in a semiconductor substrate to store electric charges. A storage gate feature is formed over the light-sensitive storage region, and includes a polysilicon gate electrode that is disposed over the light-sensitive storage region. A metal layer is formed over the storage gate feature. A silicidation process is performed to transform a part of the metal layer that is in contact with the polysilicon gate electrode into a silicide light-shielding layer. A thermal process is performed to induce lateral growth of the silicide light-shielding layer to make the silicide light-shielding layer extend to cover a lateral surface of the storage gate feature. A process temperature of the thermal process is higher than that of the silicidation process.

20 Claims, 11 Drawing Sheets

PHOTOSENSING PIXEL INCLUDING SELF-ALIGNED LIGHT SHIELDING LAYER

BACKGROUND

Imaging devices, such as digital cameras, have image sensors to convert light received thereby into electric charges, so as to present image on computer devices. Generally, an image sensor includes a plurality of photosensing pixels arranged in an array. In some applications, the photosensing pixels may each include a light-sensing region and a storage node region, where the storage node region is used to store electric charges that are generated by the light-sensing region that senses the light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
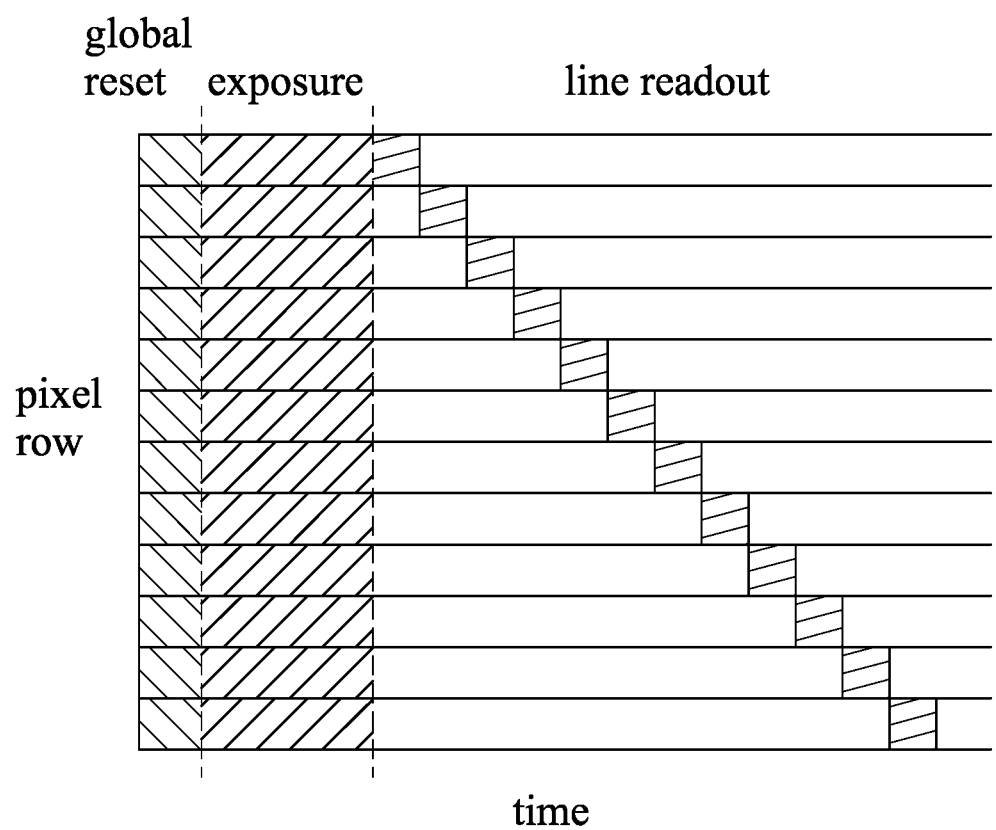
FIG. 1 is a timing diagram illustrating operation of a global shutter image sensor.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Image sensors, which are commonly used in imaging devices such as digital cameras, usually include a plurality of photosensing pixels that are arranged in an array. FIG. 1 is a timing diagram that illustrates operation of a global shutter sensor, where all photosensing pixels of the array are exposed to light at the same time during an exposure period. However, since data obtained during the exposure period are read out one row at a time, each photosensing pixel needs a storage node region to store the data that will be read out later.

Figure 2:
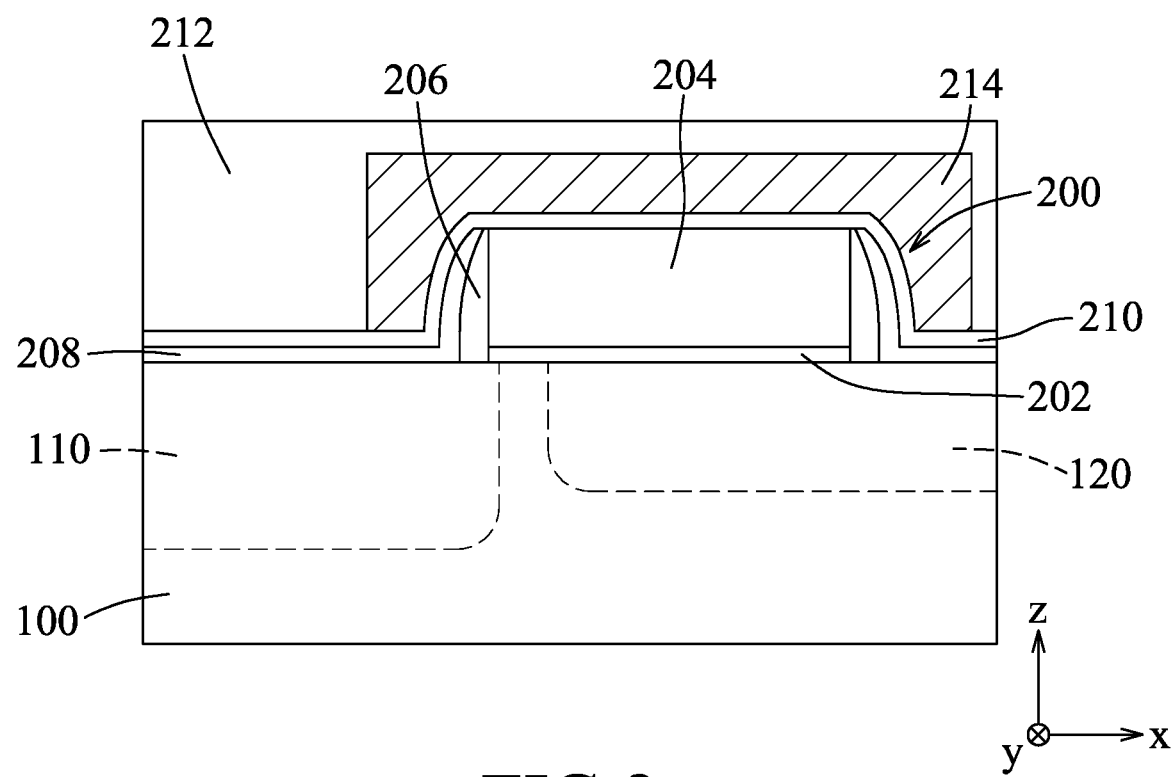
FIG. 2 is a schematic view illustrating a photosensing pixel in accordance with a first embodiment.

FIG. 2 illustrates a first embodiment of a photosensing pixel that is adapted for a global shutter image sensor according to this disclosure. The photosensing pixel includes a light-sensing region 110 and a storage node region 120 that are formed in a substrate 100, and a storage gate feature 200 that is disposed over the storage node region 120 in a z-axis direction. The substrate 100 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The substrate 100 may be made of a suitable semiconductor material, such as silicon or the like. In some embodiments, the substrate 100 is a silicon wafer; and in other embodiments, the substrate 100 is made of a compound semiconductor such as silicon carbide, gallium arsenide, indium arsenide, indium phosphide or other suitable materials. In still other embodiments, the substrate 100 is made of an alloy semiconductor such as GaAsP, AlInAs, AlGaAs, GaInAs, GaInP, GaInAsP or other suitable materials.

In some embodiments, the substrate 100 includes various p-type doped regions and/or n-type doped regions, such as p-type wells, n-type wells, p-type source/drain features and/or n-type source/drain features, formed by a suitable process such as ion implantation, thermal diffusion, a combination thereof, or the like. In some embodiments, the substrate 100 may include other functional elements such as resistors, capacitors, diodes, transistors, and/or the like. The transistors are, for example, field effect transistors (FETs), such as planar FETs and/or 3D FETs (e.g., fin field effect transistors (FinFETs)). The substrate 100 may include lateral isolation features (e.g., shallow trench isolation (STI)) configured to separate various functional elements formed on and/or in the substrate 100.

The light-sensing region 110 is configured to convert light received thereby into electric charges. In accordance with some embodiments, the light-sensing region 110 includes a photodiode structure, and is constituted by a P-N junction that includes an n-doped region and a p-doped region, but this disclosure is not limited in this respect. In accordance with some embodiments, the light-sensing region 110 may be formed through, for example but not limited to, an ion implantation process, other suitable processes, or any combination thereof.

The storage node region 120 is adjacent to the light-sensing region 110 in an x-axis direction that is transverse or perpendicular to the z-axis direction, and is disposed to receive the electric charges generated by the light-sensing region 110. In accordance with some embodiments, the storage node region 120 may include an n-doped region, a p-doped region, or both, but this disclosure is not limited in this respect. In accordance with some embodiments, the storage node region 120 may be formed through, for example but not limited to, an ion implantation process, other suitable processes, or any combination thereof.

The storage gate feature 200 includes a gate dielectric 202 that is disposed on the substrate 100 and over the light-sensing region 110 and the storage node region 120, a gate electrode 204 that is disposed over the gate dielectric 202, and a gate spacer (or sidewall spacer) 206 that surrounds the gate electrode 204 and the gate dielectric 202. The gate electrode 204 overlaps both of the light-sensing region 110 and the storage node region 120 to control entry of the electric charges from the light-sensing region 110 into the storage node region 120. In accordance with some embodiments, a region of the substrate 100 that is between the light-sensing region 110 and the storage node region 120 may be implanted with a dopant (e.g., an n-type dopant), so as to form, for example, an n-doped region, and the gate electrode 204 and the light-sensing region 110 may have a non-overlapping relationship. In accordance with some embodiments, the gate dielectric 202 may include, for example, silicon oxide, silicon nitride, silicon oxy-nitride, high-k dielectric materials, other suitable materials, or any combination thereof. In accordance with some embodiments, the gate electrode 204 may include, for example, undoped polysilicon, doped polysilicon, metal, metal compound, other suitable materials, or any combination thereof. In accordance with some embodiments, the gate spacer 206 may include, for example, silicon oxide, silicon nitride, silicon oxynitride, silicon carbide, fluoride-doped silicate glass (FSG), low-k dielectric materials, other suitable materials, or any combination thereof.

In the illustrative embodiment, the photosensing pixel further includes a resist protective oxide (RPO) layer 208 formed on the substrate 100 and the gate spacer 206, a contact etch stop layer (CESL) 210 formed on the RPO layer 208 and the gate electrode 204, and a metal light-shielding feature 214 formed on the contact etch stop layer 210 and covering the storage gate feature 200. In accordance with some embodiments, the RPO layer 208 may include, for example, silicon oxide, silicon oxynitride, oxygen-doped silicon nitride, nitrided oxides, other suitable materials, or any combination thereof. In accordance with some embodiments, the contact etch stop layer 210 may include, for example, silicon oxide, silicon nitride, silicon carbide, silicon oxynitride or combinations thereof, other suitable materials, or any combination thereof. In accordance with some embodiments, the metal light-shielding feature 214 may include, for example, tungsten (W), other suitable materials, or any combination thereof. Since the storage node region 120 may be light sensitive (e.g., electric charges may be generated therein when the storage node region 120 is irradiated by light), the metal light-shielding feature 214 is formed over the storage gate feature 200 to block light from irradiating onto the storage node region 120, so as to reduce noises (e.g., undesired/additional electric charges) generated in the storage node region 120.

Figure 3:
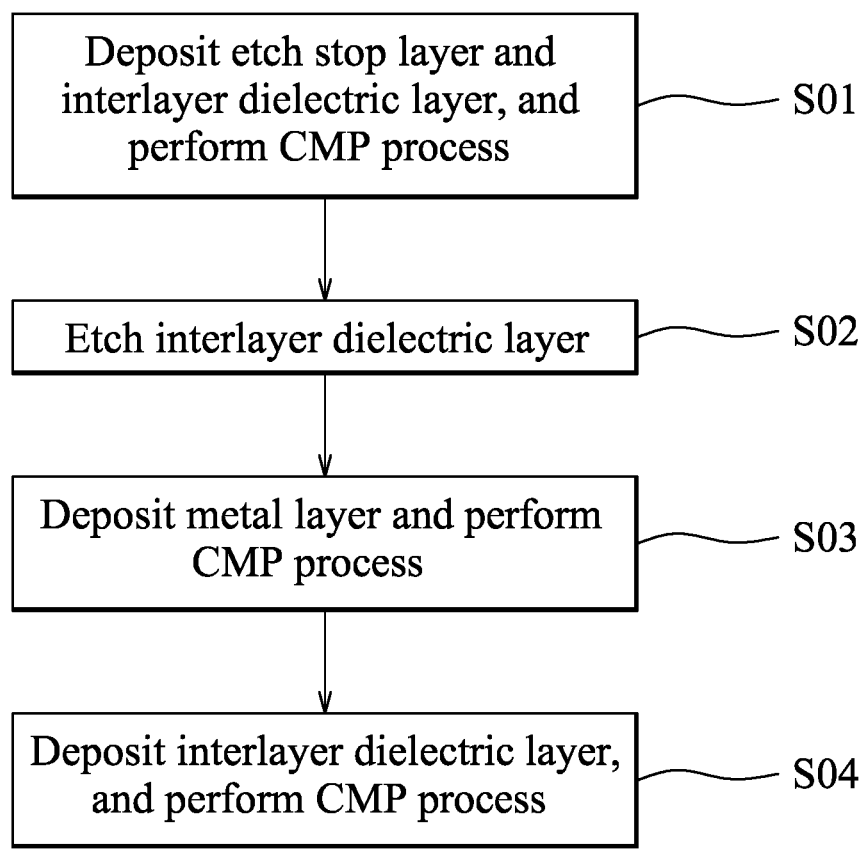
FIG. 3 is a flow chart illustrating steps of a method for forming a metal light-shielding feature for the photosensing pixel in accordance with the first embodiment.

FIG. 3 is a flow chart illustrating steps of a method for forming the metal light-shielding feature 214 for the photosensing pixel in accordance with the first embodiment.

Figure 4:
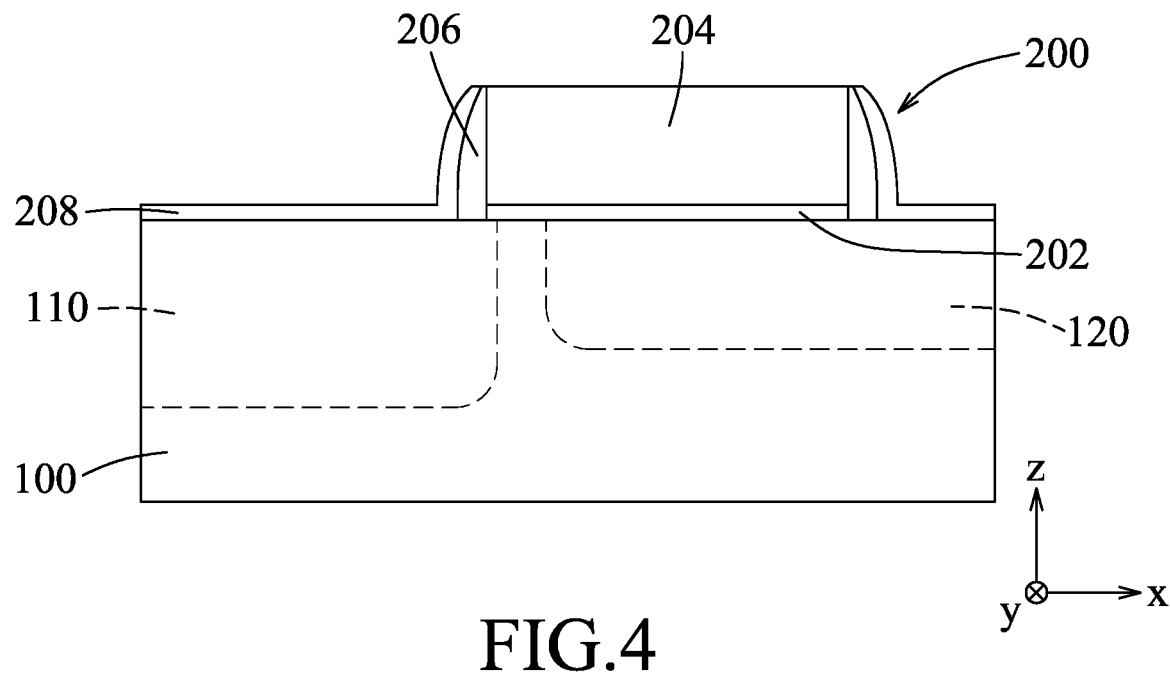
FIGS. 4 through 7 are schematic views illustrating a process for fabricating the photosensing pixel in accordance with the first embodiment.

Referring to FIG. 4, the light-sensing region 110 and the storage node region 120 are formed in the substrate 100, and the storage gate feature 200 is formed to partly overlap the light-sensing region 110 and the storage node region 120, so as to control entry of the electric charges from the light-sensing region 110 into the storage node region 120. Subsequently, the RPO layer 208 is deposited and then etched to expose the gate electrode 204.

Figure 5:
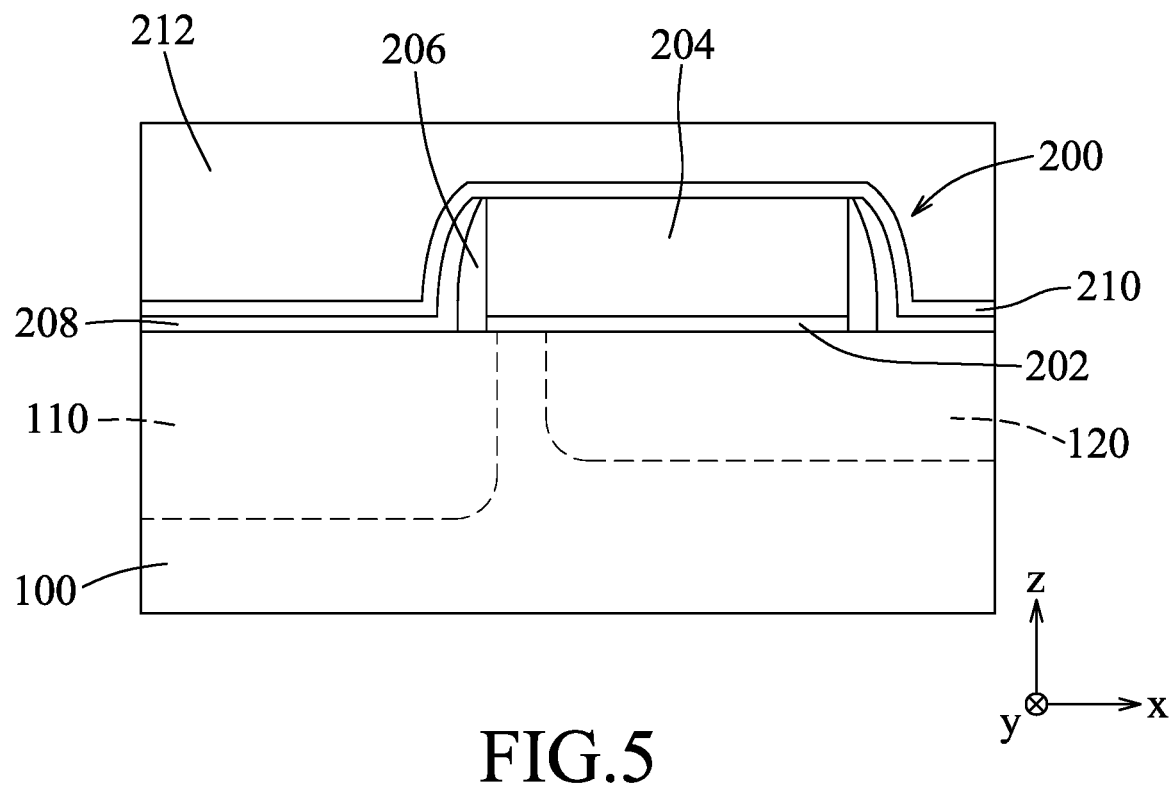

Referring to FIG. 5, in step S01, the contact etch stop layer 210 is deposited on the RPO layer 208 and the exposed gate electrode 204, and an interlayer dielectric (ILD) 212 is deposited on the contact etch stop layer 210. In accordance with some embodiments, the contact etch stop layer 210 may be formed using, for example, chemical vapor deposition (CVD), other suitable techniques, or any combination thereof. In accordance with some embodiments, the interlayer dielectric 212 may include, for example, silicon oxide, silicon nitride, silicon oxynitride, silicon carbonitride, silicon carbide oxynitride, spin-on glass (SOG), phosphosilicate glass (PSG), borophosphosilicate glass (BPSG), FSG, carbon doped silicon oxide (e.g., SiCOH), polyimide, other suitable materials, or any combination thereof, and may be formed using, for example, physical vapor deposition (PVD), CVD, plasma-enhanced CVD (PECVD), other suitable techniques, or any combination thereof. After deposition of the interlayer dielectric 212, a chemical-mechanical planarization (CMP) process is performed to planarize the interlayer dielectric 212.

Figure 6:
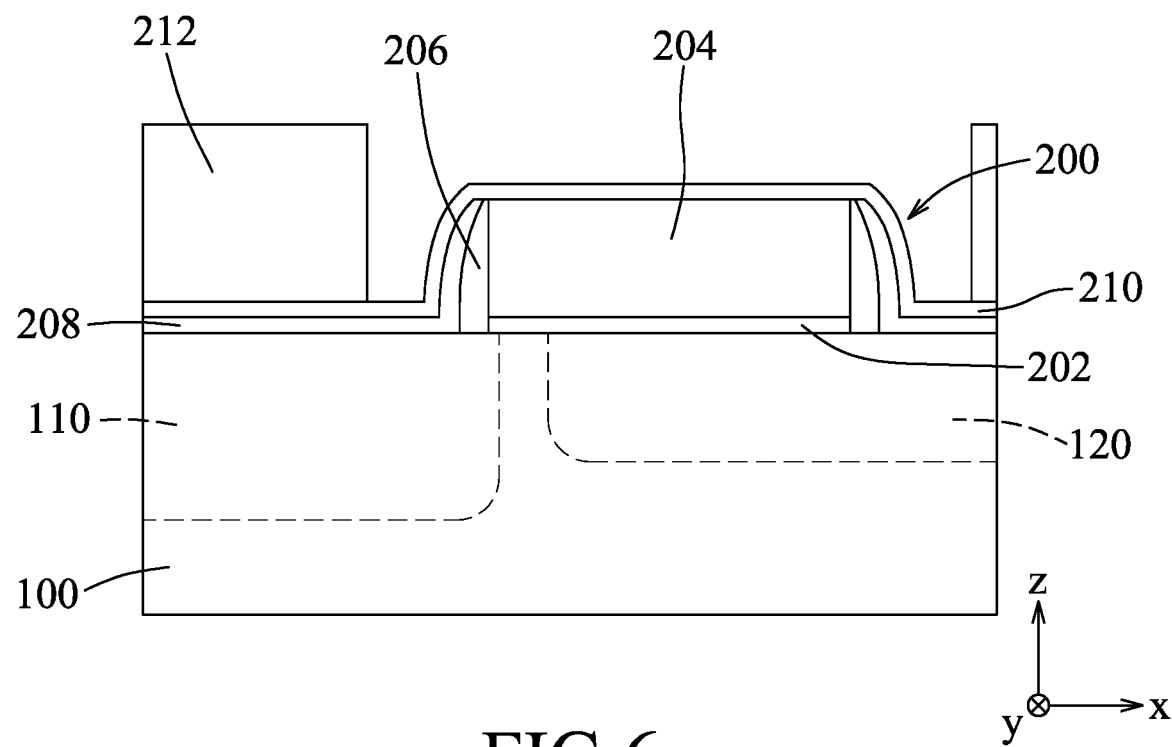

Referring to FIG. 6, in step S02, the interlayer dielectric 212 is etched to form a trench in which the metal light-shielding feature 214 (see FIG. 2) is to be formed. In accordance with some embodiments, a lithography process may be required to define a to-be-etched area with a photomask before the etching process. The interlayer dielectric 212 may be etched using, for example, dry etching, other suitable techniques, or any combination thereof. In the illustrative embodiment, the interlayer dielectric 212 is etched at an area corresponding in position to the storage gate feature 200 to expose a part of the contact etch stop layer 210 that covers the storage gate feature 200.

Figure 7:
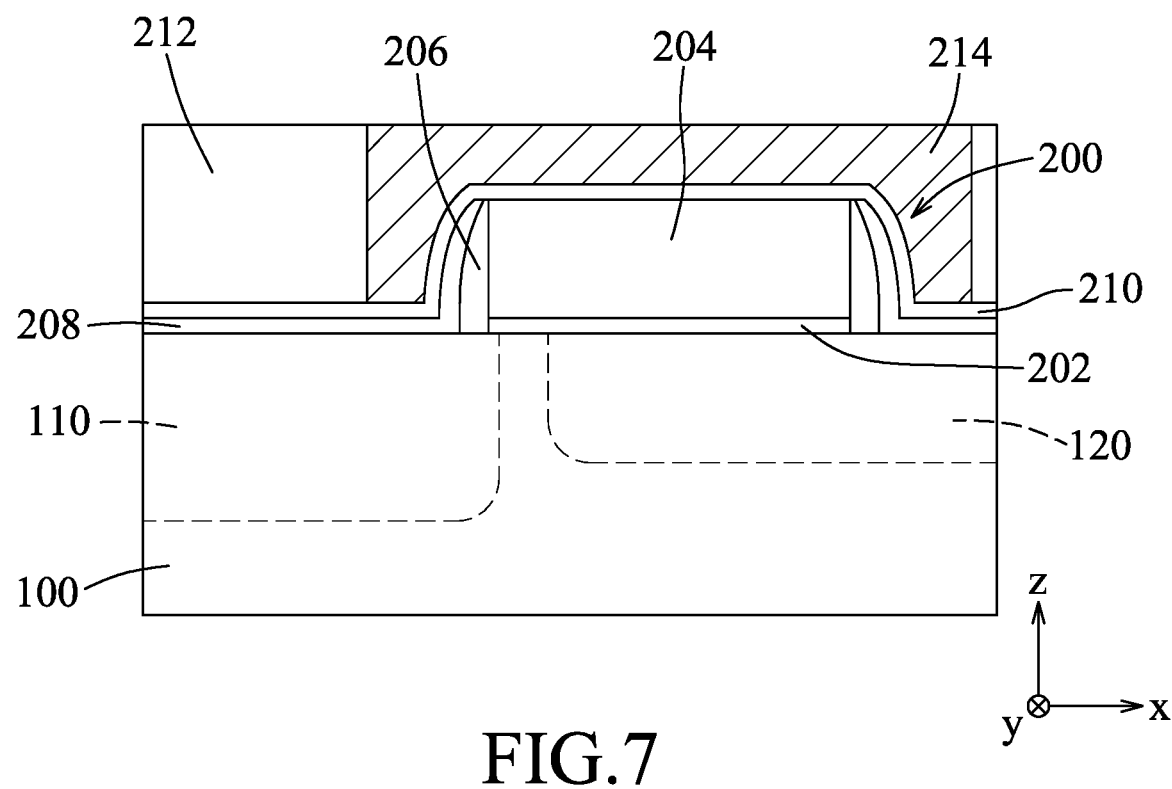

Referring to FIG. 7, in step S03, a metal layer is deposited and then a CMP process is performed to remove an undesired part (e.g., the part that is outside the trench) of the metal layer, so as to form the metal light-shielding feature 214. The metal layer may be deposited using, for example, CVD, other suitable techniques, or any combination thereof. Then, in step S04, a dielectric material is deposited again over the metal light-shielding feature 214, followed by a CMP process to planarize the dielectric material, so as to form the interlayer dielectric 212 and the structure as illustrated in FIG. 2.

Figure 8:
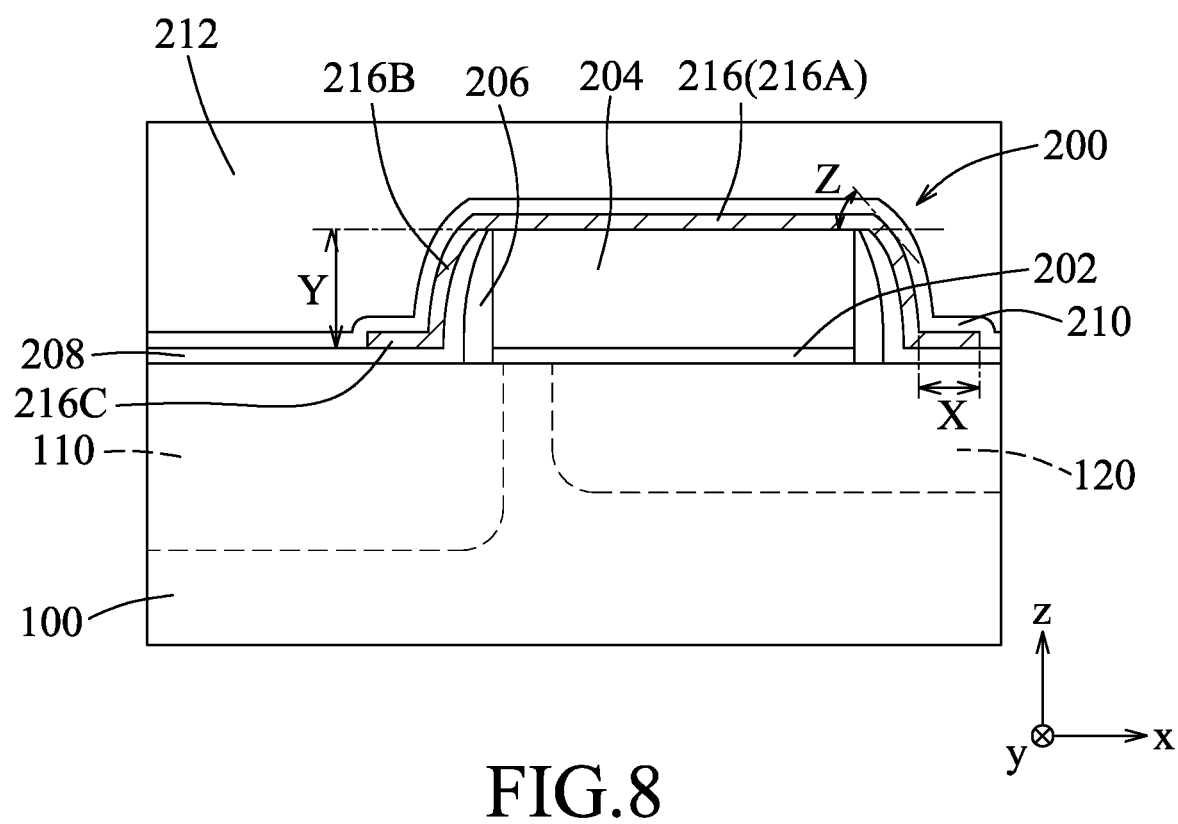
FIG. 8 is a schematic view illustrating a photosensing pixel in accordance with a second embodiment.

FIG. 8 illustrates a second embodiment of a photosensing pixel that is adapted for a global shutter image sensor according to this disclosure. The photosensing pixel includes a light-sensing region 110 and a storage node region 120 that are formed in a substrate 100, and a storage gate feature 200 that is disposed over the storage node region 120 in a z-axis direction. In the second embodiment, the configuration and arrangement of the light-sensing region 110, the storage node region 120 and the storage gate feature 200 are similar to those in the first embodiment, so details thereof are omitted herein for the sake of brevity.

In the illustrative embodiment, the photosensing pixel further includes an RPO layer 208 formed on the substrate 100 and the gate spacer 206 of the storage gate feature 200, a silicide light-shielding layer 216 formed on the RPO layer 208 and the gate electrode 204 of the storage gate feature 200, and a contact etch stop layer 210 formed on the RPO layer 208 and the silicide light-shielding layer 216. The silicide light-shielding layer 216 is in contact with the gate electrode 204, and covers the storage gate feature 200 to block light from irradiating onto the storage node region 120, so as to reduce noises generated in the storage node region 120. To be specific, the gate electrode 204 is a polysilicon gate electrode that can react with a metal material to form the silicide light-shielding layer 216. The storage gate feature 200 has a first surface (e.g., a bottom surface of the gate dielectric 202) that faces and is in contact with the substrate 100, a second surface (e.g., a top surface of the gate electrode 204) that is opposite to the first surface, and a lateral surface (a surface of the gate spacer 206 opposite to the gate electrode 204) that interconnects the first surface and the second surface. The silicide light-shielding layer 216 has a first light-shielding portion 216A that is disposed over and covers the second surface of the storage gate feature 200, a second light-shielding portion 216B that extends from the first light-shielding portion 216A to cover the lateral surface of the storage gate feature 200, and a third light-shielding portion 216C that extends from the second light-shielding portion 216B and away from the storage gate feature 200 (i.e., X>0 in FIG. 8). The first light-shielding portion 216A extends laterally on an x-y plane, which is defined by an x-axis direction and a y-axis direction that are both perpendicular to the z-axis direction, and is in contact with the gate electrode 204. The second light-shielding portion 216B extends from an edge of the first light-shielding portion 216A to a lower part of the RPO layer 208 (e.g., the part that is in contact with the substrate 100). The first light-shielding portion 216A and the second light-shielding portion 216B form an angle that is greater than zero degrees (i.e., Z>0° in FIG. 8), which means that the second light-shielding portion 216B extends in a different direction from the first light-shielding portion 216A. In addition, the second light-shielding portion 216B is disposed over the gate spacer 206. The third light-shielding portion 216C extends laterally on the x-y plane from a lower end of the second light-shielding portion 216B, and is lower than the first light-shielding portion 216A (i.e., Y>0) with respect to the substrate 100. The first light-shielding portion 216A is configured to block light coming from above, the second light-shielding portion 216B is configured to block light coming from a side, and the third light-shielding portion 216C is an extension of the second light-shielding portion 216B to further reduce the possibility of light coming from a side traveling to the storage node region 120 through a gap between the lower end of the second light-shielding portion 216B and the substrate 100. In the illustrative embodiment, the silicide light-shielding layer 216 has a width greater than a width of the storage gate feature 200 in a widthwise direction (e.g., an arbitrary lateral direction that is perpendicular to the z-axis direction), and completely covers the storage gate feature 200, but this disclosure is not limited in this respect. In some embodiments, the silicide light-shielding layer 216 may be formed to not include the third light-shielding portion 216C. In some embodiments, the silicide light-shielding layer 216 may be formed to not include the third light-shielding portion 216C, and the second light-shielding portion 216C does not extend to reach the lower part of the RPO layer 208, and covers only an upper part of the lateral surface of the storage gate feature 200. In accordance with some embodiments, the silicide light-shielding layer 216 may have a thickness greater than or equal to 100 angstroms in order to achieve effective light shielding. In the illustrative embodiment, the silicide light-shielding layer 216 is formed as a hat-shaped feature where the first light-shielding portion 216A and the second light-shielding portion 216B cooperatively form a crown portion that covers the storage gate feature 200, and the third light-shielding portion 216C serves as a brim portion that extends outward from the crown portion. In accordance with some embodiments, the silicide light-shielding layer 216 may include, for example, Co-silicide, Ti-silicide, Ta-silicide, other suitable materials, or any combination thereof. In accordance with some embodiments, the contact etch stop layer 210 may be omitted. Since the storage node region 120 may be light sensitive, the silicide light-shielding feature 216 is formed over the storage gate feature 200 to block light from irradiating onto the storage node region 120, so as to reduce noises generated in the storage node region 120. It is noted that application of the present disclosure (e.g., the formation of the metal light-shielding feature 214 or the silicide light-shielding layer 216) is not limited to photosensing pixels, and the present disclosure may be applicable to other components that need to be protected from irradiation of light.

It is noted that, in the illustrative embodiment, the photosensing pixel is exemplified to include one storage node region 120, one polysilicon gate electrode 204, one gate spacer 206, one silicide light-shielding layer 216 and one contact etch stop layer 210, but this disclosure is not limited to the number of those elements. In accordance with some embodiments, the photosensing pixel may include more than one storage node region 120, more than one polysilicon gate electrode 204, more than one gate spacer 206, more than one silicide light-shielding layer 216 or more than one contact etch stop layer 210, and this disclosure is not limited in this respect.

Figure 9:
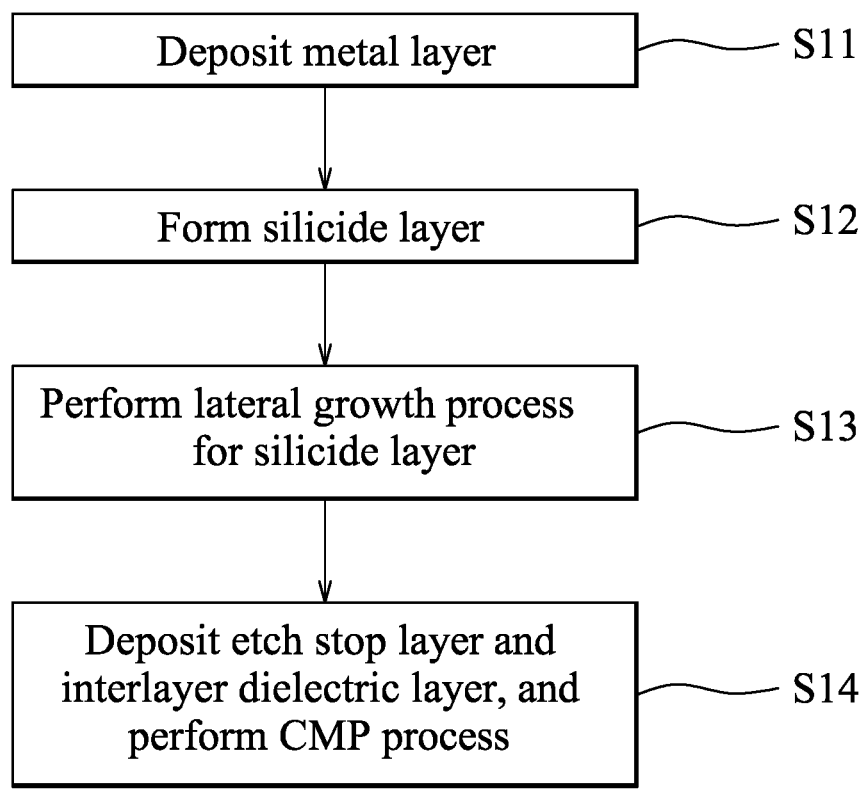
FIG. 9 is a flow chart illustrating steps of a method for forming a silicide light-shielding layer for the photosensing pixel in accordance with the second embodiment.

FIG. 9 is a flow chart illustrating steps of a method for forming the silicide light-shielding feature 216 for the photosensing pixel in accordance with the second embodiment.

Similar to the first embodiment, prior to the method as illustrated in FIG. 9, the light-sensing region 110 and the storage node region 120 are formed in the substrate 100, the storage gate feature 200 is formed to partly overlap the light-sensing region 110 and the storage node region 120, and the RPO layer 208 is deposited and then etched to expose the gate electrode 204, as shown in FIG. 4. Specifically, the gate electrode 204 of the storage gate feature 200 is a polysilicon gate electrode, so as to react with a metal material to form the silicide light-shielding layer 216 in a later process.

Figure 10:
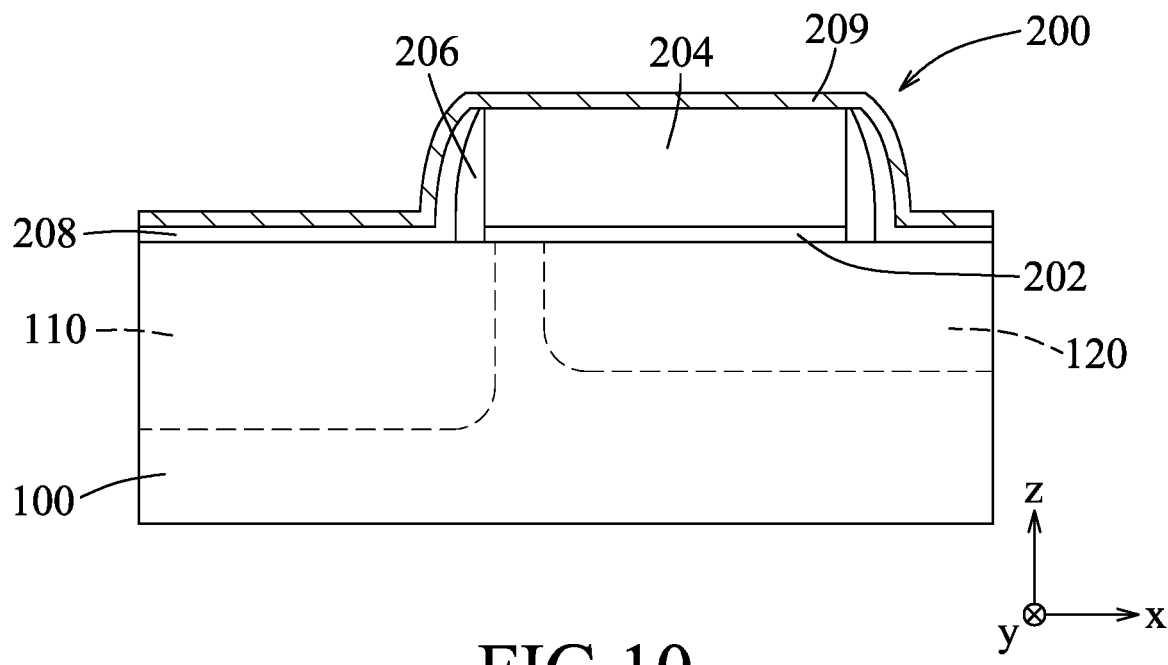
FIGS. 10 through 12 are schematic views illustrating a process for fabricating the photosensing pixel in accordance with the second embodiment.

Referring to FIG. 10, in step S11, a metal layer 209 is deposited over the RPO layer 208 and the storage gate feature 200 to be in contact with the polysilicon gate electrode 204. In the illustrative embodiment, the metal layer 209 is made of a material that makes silicon a dominant diffuser during the subsequent silicidation process, namely, the silicidation is induced mainly from diffusion of silicon in the polysilicon gate electrode 204 into the metal layer 209, rather than from diffusion of the metal in the metal layer 209 into the polysilicon gate electrode 204. In accordance with some embodiments, the metal layer 209 may include, for example, Co, Ti, Ta, other suitable metals that have the abovementioned property, or any combination thereof, and may be formed using, for example, sputtering, CVD, PVD, other suitable techniques, or any combination thereof.

Figure 11:
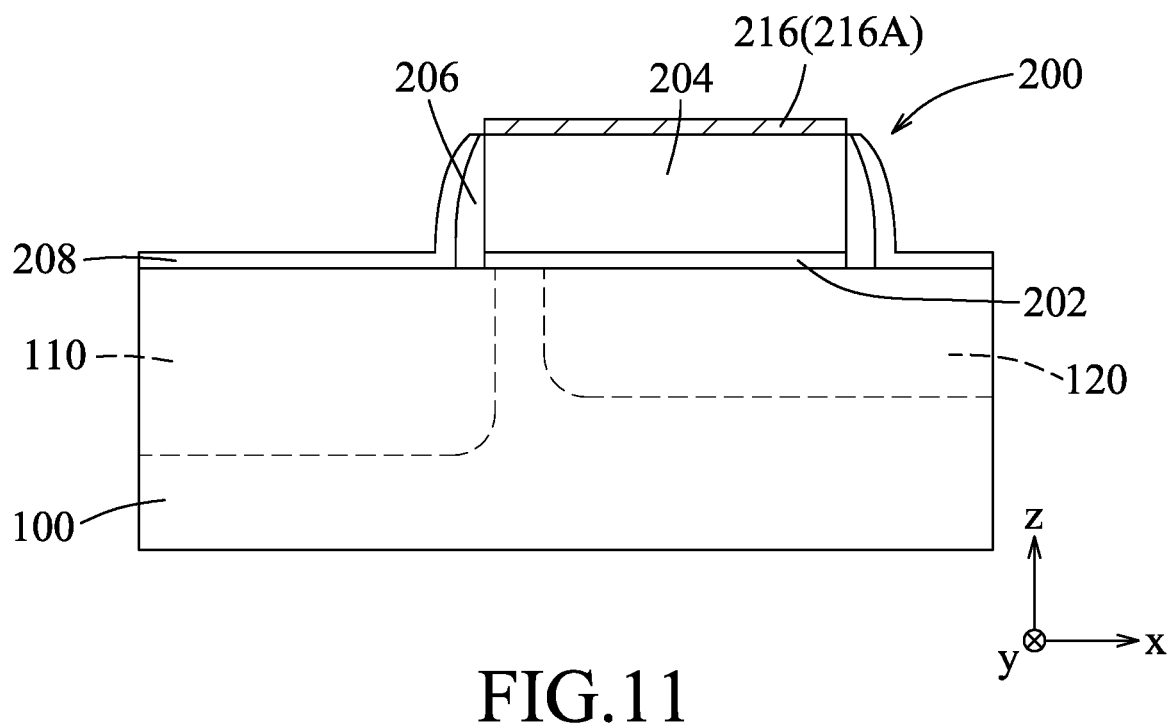

Referring to FIG. 11, in step S12, a silicidation process is performed to transform a part of the metal layer 209 (see FIG. 10) that is in contact with the polysilicon gate electrode 204 into the silicide light-shielding layer 216, and then the remaining part of the metal layer 209 is removed by etching, so as to leave only the silicide light-shielding layer 216 that is over the polysilicon gate electrode 204 (i.e., the first light-shielding portion 216A). In accordance with some embodiments, the silicidation process is, for example, a thermal process that has a process temperature depending on the material used in the metal layer 209. In accordance with some embodiments, the metal layer 209 may be etched using, for example, wet chemical etching that has good etch selectivity between the metal layer 209 and the silicide light-shielding layer 216, other suitable techniques, or any combination thereof. In the illustrative embodiment, since silicon is the dominant diffuser during the silicidation process, silicide (i.e., the silicide light-shielding layer 216) is formed over the polysilicon gate electrode 204 by diffusion of silicon in the polysilicon gate electrode 204 into the metal layer 209 which is above the polysilicon gate electrode 204, rather than the polysilicon gate electrode 204 being transformed into silicide.

Figure 12:
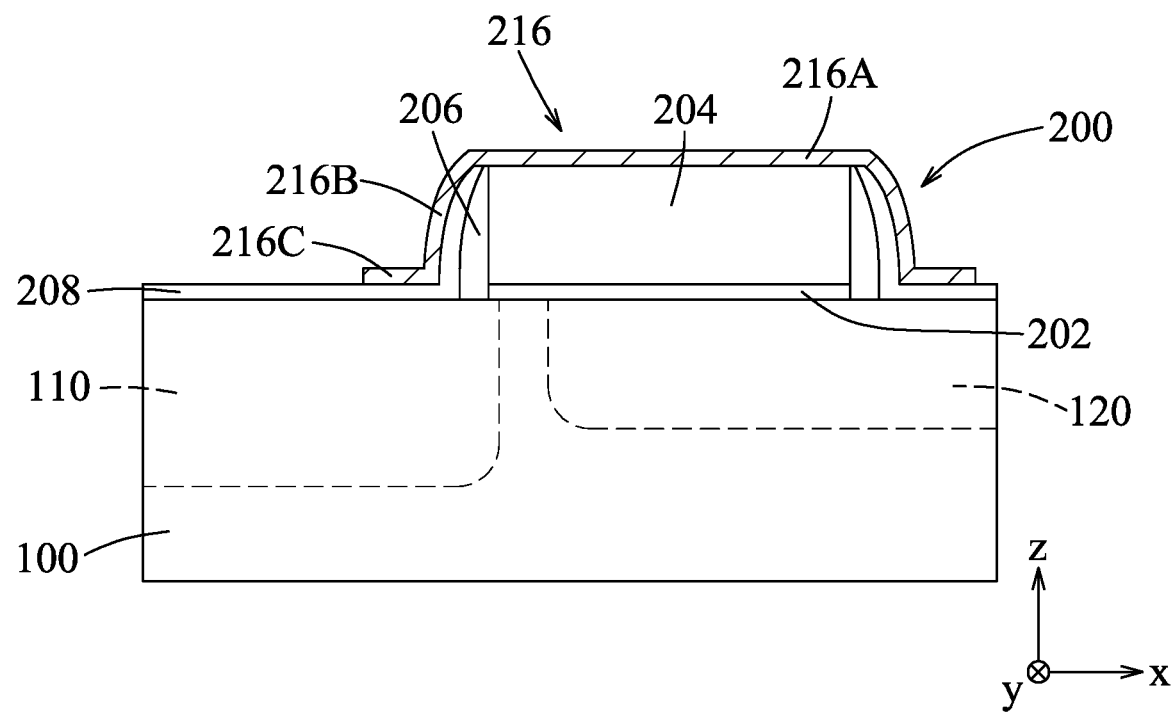

Referring to FIG. 12, in step S13, a thermal process is performed to induce lateral growth of the silicide light-shielding layer 216, so as to make the silicide light-shielding layer 216 extend onto and cover the lateral surface of the storage gate feature 200. In accordance with some embodiments, the thermal process for the lateral growth has a process temperature that is higher than the process temperature of the silicidation process. In accordance with some embodiments, the thermal process for the lateral growth has a process time longer than the silicidation process in order to ensure sufficient extension of the silicide light-shielding layer 216, so the silicide light-shielding layer 216 can cover the storage gate feature 200 as desired. In addition, the thermal process for the lateral growth may also improve the property of the silicide light-shielding layer 216, such as reducing the sheet resistance. In the illustrative embodiment, the metal layer 209 (see FIG. 10) uses a material making silicon the dominant diffuser during the silicidation process, so silicide (i.e., the silicide light-shielding layer 216) is formed over the polysilicon gate electrode 204, and the lateral growth of the silicide can thus be induced. If the metal layer 209 uses a material that makes the metal in the metal layer 209 a dominant diffuser during the silicidation process, the polysilicon gate electrode 204 may be transformed into silicide, and the lateral growth of the silicide may not be induced because the polysilicon gate electrode 204 is surrounded by the gate spacer 206.

In the illustrative embodiment, the thermal process for the lateral growth is performed after the etching of the metal layer 209, but this disclosure is not limited in this respect. In accordance with some embodiments, the thermal process for the lateral growth is performed between the silicidation process and the etching of the metal layer 209, and the silicide light-shielding layer 216 may have a structure as shown in FIG. 12 right after the etching of the metal layer 209. In accordance with some embodiments, the thermal process for the lateral growth may be divided into two stages, where the first stage is performed between the silicidation process and the etching of the metal layer 209, and the second stage is performed after the etching of the metal layer 209. For example, the silicide light-shielding layer 216 may extend to form, for example, the entire second light-shielding portion 216B or a part of the second light-shielding portion 216B in the first stage, and the silicide light-shielding layer 216 extends to the desire extent (e.g., forming the third light-shielding portion 216C) in the second stage.

Then, in step S14, the contact etch stop layer 210 and the interlayer dielectric 212 are deposited over the RPO layer 208 and the silicide light-shielding layer 216, followed by a CMP process to planarize the interlayer dielectric 212, so as to form the structure as illustrated in FIG. 8.

In the second embodiment, the salicide (self-aligned silicide) technology, which is a mature process in complementary metal-oxide-semiconductor (CMOS) fabrication, is used to form the silicide light-shielding layer 216, and no lithography process is needed to form the silicide light-shielding layer 216, so the design of the photosensing pixel may be more compact because the design tolerance for process variations such as overlay errors from a lithography process (which is required in the first embodiment to form the metal light-shielding feature 214 (see FIG. 2)) can be omitted. The second embodiment may be more cost effective when compared with the first embodiment because the second embodiment performs the CMP process only once, while the first embodiment performs the CMP processes three times. Further, since the silicide light-shielding layer 216 is under the contact etch stop layer 210, the silicide light-shielding layer 216 of the second embodiment is closer to the substrate 100 than the metal light-shielding feature 214, which is formed over the contact etch stop layer 210, so the silicide light-shielding layer 216 of the second embodiment can provide better light shielding than the metal light-shielding feature 214 of the first embodiment.

Figure 13:
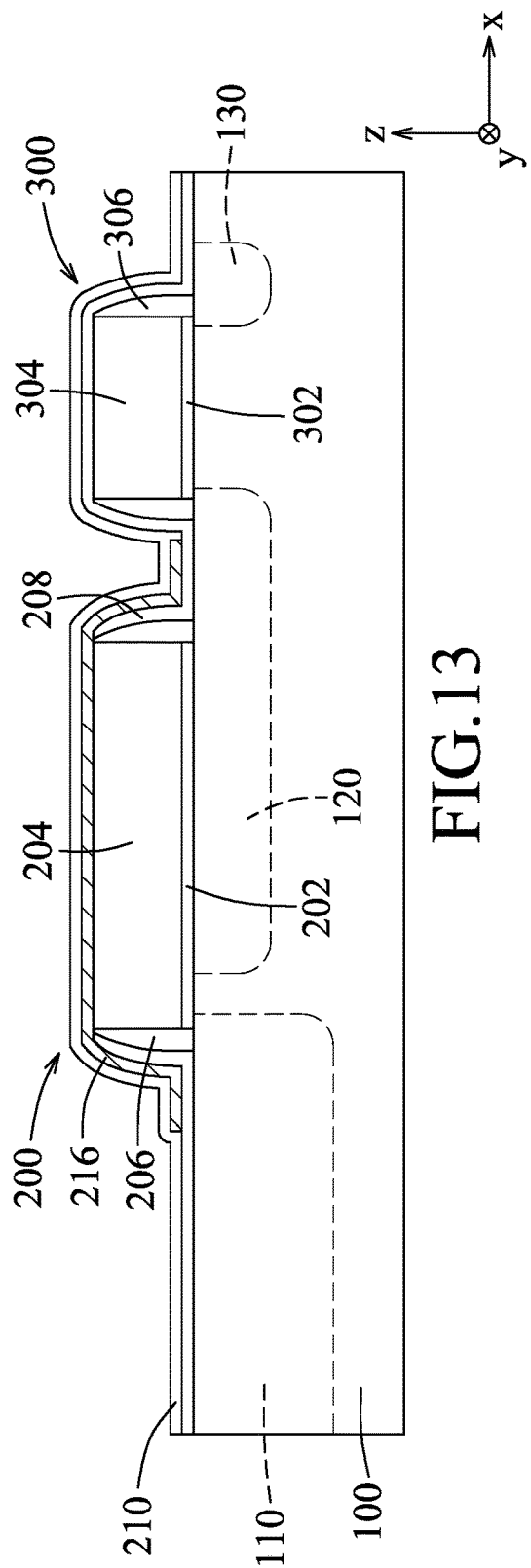
FIGS. 13 and 14 are schematic views illustrating a photosensing pixel in accordance with the some embodiments.
Figure 14:
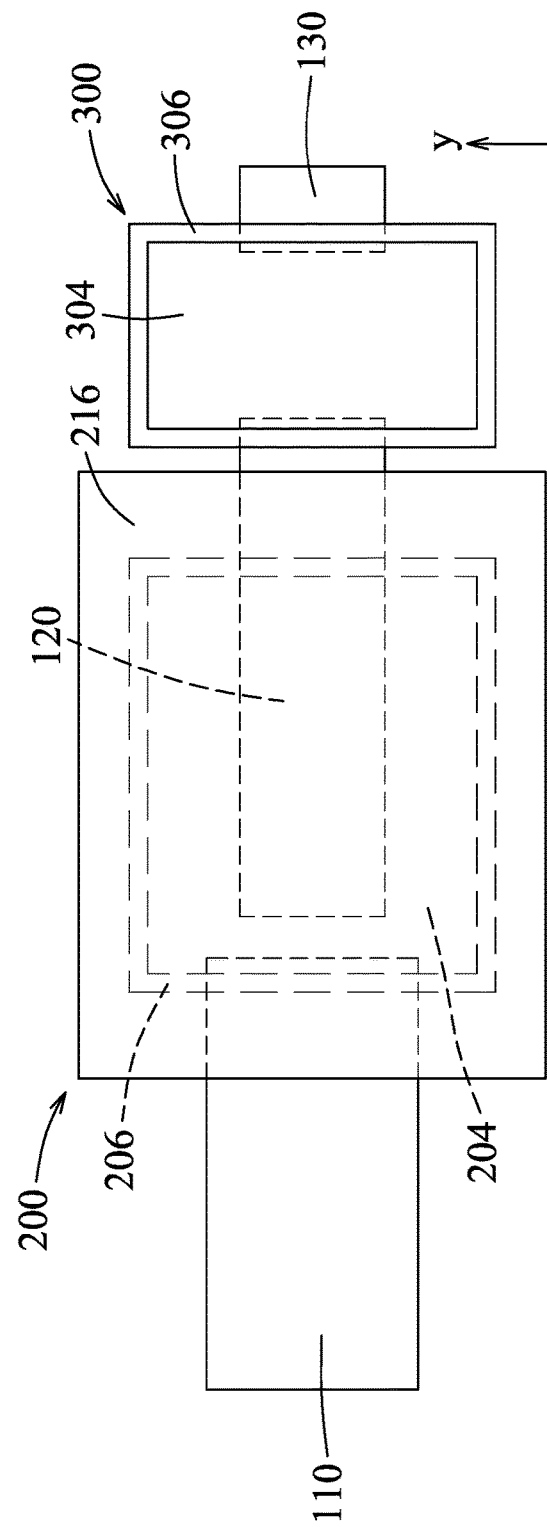

In accordance with some embodiments, the photosensing pixel of the second embodiment may further include a transfer gate feature 300, as illustrated in FIG. 13, where a sectional view of the photosensing pixel is shown. The transfer gate feature 300 is adjacent to the storage gate feature 200, and is operable to allow readout of the data stored in the storage node region 120. In the illustrative embodiment, the transfer gate feature 300 is covered by the RPO layer 208 and the contact etch stop layer 210, and includes a gate dielectric 302 disposed over the substrate 100, a gate electrode 304 disposed over the gate dielectric 302, and a gate spacer 306 surrounding the gate dielectric 302 and the gate electrode 304. FIG. 14 illustrates a top view of the photosensing pixel, where the gate dielectrics 202, 302, the RPO layer 208 and the contact etch stop layer 210 are omitted for the sake of clarity. The gate electrode 304 and the gate dielectric 302 overlap the storage node region 120 and a charge sensing node region 130 that is formed in the substrate 100 and that is spaced apart from the storage node region 120. When the gate electrode 304 is turned on, the electric charges in the storage node region 120 may be read out through the charge sensing node region 130. In accordance with some embodiments, the storage gate feature 200 and the transfer gate feature 300 may be formed in the same process steps, but this disclosure is not limited in this respect. In the illustrative embodiment, the RPO layer 208 is not formed with an opening that corresponds in position to the gate electrode 304 of the transfer gate feature 300, so no silicide is formed over the gate electrode 304, but this disclosure is not limited in this respect.

Figure 15:
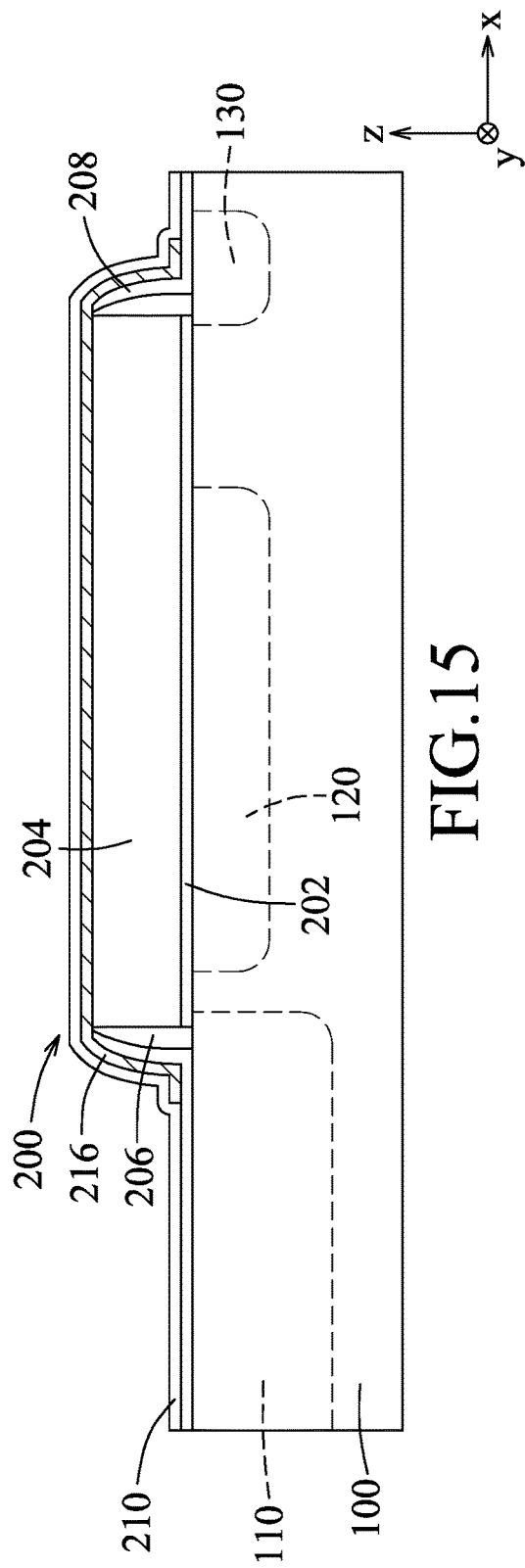
FIGS. 15 and 16 are schematic views illustrating a photosensing pixel in accordance with the some embodiments.
Figure 16:
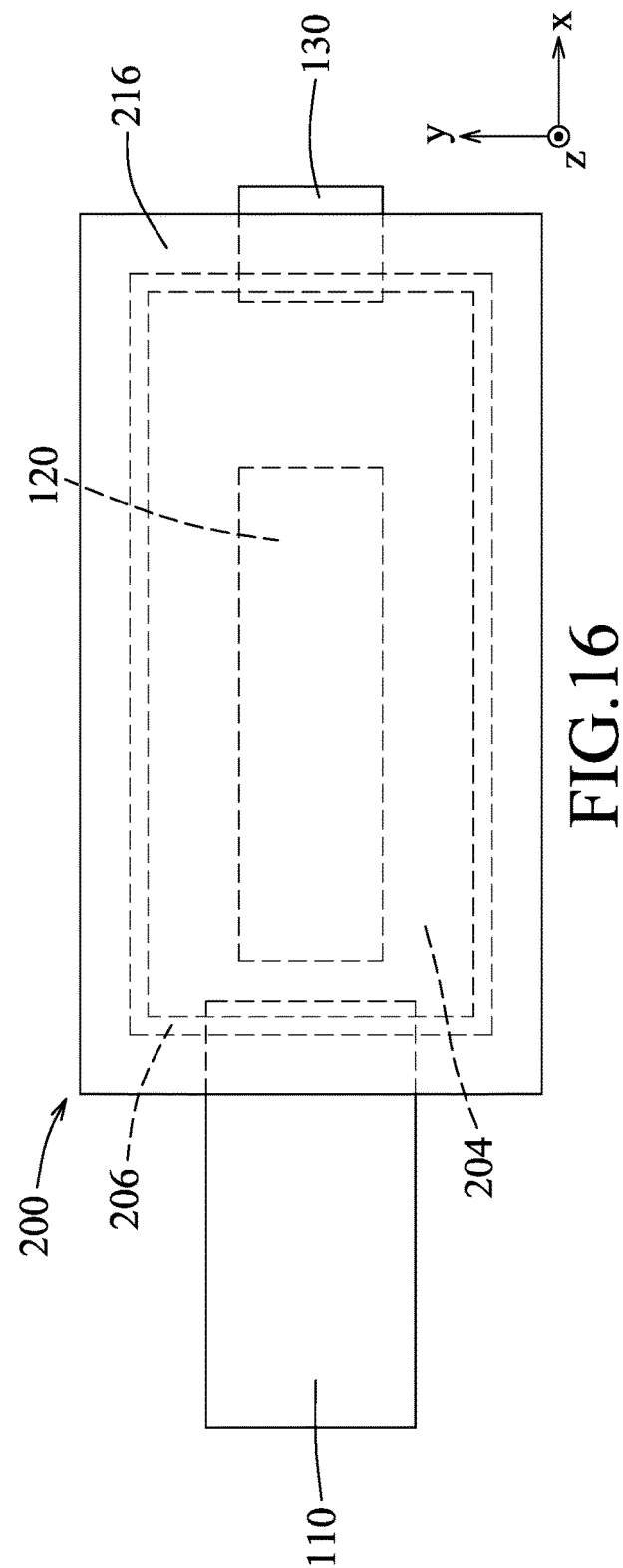

In accordance with some embodiments, the transfer gate feature 300 in FIGS. 13 and 14 may be integrated with the storage gate feature 200, as illustrated in FIGS. 15 and 16 that show a sectional view and a top view of the photosensing pixel, respectively. In the illustrative embodiment, the gate electrode 204 and the gate dielectric 202 extend from the light-sensing region 110 to the charge-sensing node region 130, and completely overlap the storage node region 120, and thus the silicide light-shielding layer 216 completely covers the storage node region 120 in the illustrative embodiment.

In summary, a metal light-shielding feature 214 or a silicide light-shielding layer 216 is formed to cover the storage gate feature 200 in accordance with some embodiments to block irradiation of light onto the storage node region 120, so as to reduce noises that may be generated in the storage node region 120. In accordance with some embodiments, the silicide light-shielding layer 216 is formed by a salicide process, so the photosensing pixel may be designed to be more compact, and chip area can thus be saved. The salicide process to form the silicide light-shielding feature 216 requires fewer CMP processes than forming the metal light-shielding feature 214, so the manufacturing cost can be reduced. Because of the salicide process, the silicide light-shielding layer 216 is in contact with the gate electrode 204 of the storage gate feature 200, without having a contact etch stop layer 210 disposed between the storage gate feature 200 and the light-shielding layer, so the silicide light-shielding layer 216 can be closer to the substrate 100, providing better light shielding.

In accordance with some embodiments, a method is provided for forming a light-shielding layer to block light from irradiating onto a light-sensitive storage region that is formed in a semiconductor substrate. In one step, a storage gate feature is formed over the light-sensitive storage region that is configured to store electric charges. The storage gate feature includes a polysilicon gate electrode that is disposed over the light-sensitive storage region and that is configured to control entry of the electric charges into the light-sensitive storage region. In one step, a metal layer is formed over the storage gate feature. In one step, a silicidation process is performed to transform a part of the metal layer that is in contact with the polysilicon gate electrode into a silicide light-shielding layer. In one step, a thermal process is performed to induce lateral growth of the silicide light-shielding layer to make the silicide light-shielding layer extend to cover a lateral surface of the storage gate feature, wherein a process temperature of the thermal process is higher than that of the silicidation process.

In accordance with some embodiments, the method further includes, between the step of performing the silicidation process and the step of performing the thermal process, a step of etching the metal layer to remove the metal layer.

In accordance with some embodiments, the method further includes, after the step of performing the thermal process, a step of etching the metal layer to remove the metal layer.

In accordance with some embodiments, the method further include, after performing the thermal process, a step of forming an etch stop layer over the silicide light-shielding layer.

In accordance with some embodiments, the metal layer includes one of Co, Ti and Ta.

In accordance with some embodiments, the storage gate feature further includes a gate spacer that surrounds the polysilicon gate electrode, and the silicide light-shielding layer extends to cover the gate spacer in the step of performing the thermal process.

In accordance with some embodiments, a photosensing pixel is provided to include a light-sensing region, a storage node region and a silicide light-shielding layer. The light-sensing region is formed in a semiconductor substrate, and is configured to convert light received thereby into electric charges. The storage node region is formed in the semiconductor substrate, and is disposed to receive and store the electric charges generated by the light-sensing region. The silicide light-shielding layer is disposed over and covering the storage node region.

In accordance with some embodiments, the photosensing pixel further includes a storage gate feature that includes a polysilicon gate electrode disposed over the storage node region to control entry of the electric charges into the storage node region. The silicide light-shielding layer is disposed over and covers the storage gate feature, and is in contact with the polysilicon gate electrode.

In accordance with some embodiments, the storage gate feature has a first surface facing the semiconductor substrate, a second surface opposite to the first surface, and a lateral surface interconnecting the first surface and the second surface. The silicide light-shielding layer has a first light-shielding portion that covers the second surface of the storage gate feature, and a second light-shielding portion that extends from the first light-shielding portion to cover the lateral surface of the storage gate feature.

In accordance with some embodiments, the silicide light-shielding layer further has a third light-shielding portion that extends from the second light-shielding portion and away from the storage gate feature.

In accordance with some embodiments, the third light-shielding portion of the silicide light-shielding layer is lower than the first light-shielding portion of the silicide light-shielding layer with respect to the semiconductor substrate.

In accordance with some embodiments, the silicide light-shielding layer has a width in a widthwise direction that is greater than a width of the storage gate feature in the widthwise direction, and completely covers the storage gate feature.

In accordance with some embodiments, an angle formed by the first light-shielding portion and the second light-shielding portion of the silicide light-shielding layer is greater than zero degrees.

In accordance with some embodiments, the storage gate feature includes a gate spacer that surrounds the polysilicon gate electrode, and the silicide light-shielding layer is disposed over the gate spacer.

In accordance with some embodiments, the photosensing pixel further includes an etch stop layer formed over the silicide light-shielding layer.

In accordance with some embodiments, the silicide light-shielding layer includes one of Co-silicide, Ti-silicide and Ta-silicide.

In accordance with some embodiments, a photosensing pixel is provided to include a light-sensing region, a storage node region, a storage gate feature and a hat-shaped silicide light-shielding feature. The light-sensing region is formed in a semiconductor substrate, and is configured to convert light received thereby into electric charges. The storage node region is formed in the semiconductor substrate, and is disposed to receive and store the electric charges generated by the light-sensing region. The storage gate feature is disposed over the storage node region to control entry of the electric charges into the storage node region. The hat-shaped silicide light-shielding feature covers the storage gate feature.

In accordance with some embodiments, the storage gate feature includes a polysilicon gate electrode, and the silicide light-shielding feature is in contact with the polysilicon gate electrode.

In accordance with some embodiments, the hat-shaped silicide light-shielding feature includes a crown portion that covers the storage gate feature, and a brim portion that extends outward from the crown portion.

In accordance with some embodiments, the hat-shaped silicide light-shielding feature includes one of Co-silicide, Ti-silicide and Ta-silicide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a light-shielding layer to block light from irradiating onto a light-sensitive storage region that is formed in a semiconductor substrate, comprising steps of:
    forming a storage gate feature over the light-sensitive storage region that is configured to store electric charges, wherein the storage gate feature includes a polysilicon gate electrode that is disposed over the light-sensitive storage region and that is configured to control entry of the electric charges into the light-sensitive storage region;
    forming a metal layer over the storage gate feature;
    performing a silicidation process to transform a part of the metal layer that is in contact with the polysilicon gate electrode into a silicide light-shielding layer; and
    inducing lateral growth of the silicide light-shielding layer to make the silicide light-shielding layer extend to cover a lateral surface of the storage gate feature.

2. The method according to claim 1, further comprising, after the step of performing the silicidation process, a step of removing a remaining part of the metal layer that has not been transformed into the silicide light-shielding layer.

3. The method according to claim 1, further comprising, after inducing the lateral growth of the silicide light-shielding layer, a step of forming an etch stop layer over the silicide light-shielding layer.

4. The method according to claim 1, wherein the storage gate feature further includes a gate spacer that surrounds the polysilicon gate electrode, and the silicide light-shielding layer extends to cover the gate spacer in the step of inducing the lateral growth of the silicide light-shielding layer.

5. The method according to claim 1, further comprising, after inducing the lateral growth of the silicide light-shielding layer, a step of removing the metal layer.

6. The method according to claim 1, further comprising, between the step of performing a silicidation process and the step of inducing the lateral growth of the silicide light-shielding layer, a step of removing the metal layer.

7. The method according to claim 1, wherein the lateral growth of the silicide light-shielding layer is induced using a thermal process that has a process temperature higher than a process temperature of the silicidation process.

8. The method according to claim 1, wherein the lateral growth of the silicide light-shielding layer is induced using a thermal process that has a process time longer than a process time of the silicidation process.

9. The method according to claim 1, further comprising, after the step of inducing lateral growth of the silicide light-shielding layer to make the silicide light-shielding layer extend to cover a lateral surface of the storage gate feature, steps of:
    removing the metal layer; and
    inducing another lateral growth of the silicide light-shielding layer to make the silicide light-shielding layer extend to form an extending portion of the silicide light-shielding layer, wherein the extending portion extends from an end of a portion of the silicide light-shielding layer that covers a lateral surface of the storage gate feature, extending and the extending portion extends away from the storage gate feature.

10. The method according to claim 1, wherein the metal layer includes one of Co, Ti and Ta.

11. A method for forming a light-shielding layer to block light from irradiating onto a light-sensitive storage region that is formed in a semiconductor substrate, comprising:
    forming a storage gate feature over the light-sensitive storage region, wherein the storage gate feature includes a silicon-based gate electrode that is disposed over the light-sensitive storage region;
    depositing a metal layer over the storage gate feature;
    inducing diffusion of silicon in the silicon-based gate electrode into the metal layer, thereby forming a silicide light-shielding layer on top of the storage gate feature; and
    inducing lateral growth of the silicide light-shielding layer, thereby causing the silicide light-shielding layer to have a crown portion that covers a top surface and a lateral surface of the storage gate feature.

12. The method according to claim 11, wherein the lateral growth of the silicide light-shielding layer further causes the silicide light-shielding layer to have a brim portion that extends outward from the crown portion.

13. The method according to claim 11, wherein the diffusion of silicon in the silicon-based gate electrode into the metal layer is induced by performing a first thermal process that has a first process temperature, and the lateral growth of the silicide light-shielding layer is induced by performing a second thermal process that has a second process temperature higher than the first process temperature.

14. The method according to claim 11, wherein the metal layer includes one of Co, Ti and Ta, and the silicide light-shielding layer includes one of Co-silicide, Ti-silicide and Ta-silicide.

15. The method according to claim 11, further comprising:
    removing the metal layer after the silicide light-shielding layer is formed; and
    depositing an etch stop layer over the silicide light-shielding layer.

16. The method according to claim 11, wherein no lithography process is performed between the deposition of the metal layer and the forming of the silicide light-shielding layer.

17. A method for forming a light-shielding layer to block light from irradiating onto a light-sensitive storage region that is formed in a semiconductor substrate, the method comprising:
    forming a storage gate feature over the light-sensitive storage region, wherein the storage gate feature includes a storage gate electrode that is disposed over the light-sensitive storage region;
    forming a protective layer over the storage gate feature, the protective layer having an opening that exposes the storage gate electrode;

forming a metal layer over the protective layer and the storage gate electrode; and forming a part of the metal layer that corresponds in position to the storage gate electrode into a light-shielding layer, wherein the semiconductor substrate has a charge-sensing node region spaced apart from the light-sensitive storage region, and the method comprises:

forming a transfer gate feature over the charge-sensing node region, wherein the transfer gate feature includes a transfer gate electrode that is disposed over the charge-sensing node region; and wherein the protective layer covers the transfer gate electrode to separate the metal layer from the transfer gate electrode when the metal layer is formed.

18. The method according to claim 17, further comprising a step of inducing lateral growth of the light-shielding layer to make the light-shielding layer extend to cover a lateral surface of the storage gate feature.

19. The method according to claim 18, wherein the lateral growth of the light-shielding layer is induced using a thermal process that has a process temperature higher than a process temperature of forming the part of the metal layer into the light-shielding layer.

20. The method according to claim 18, wherein the lateral growth of the light-shielding layer is induced using a thermal process that has a process time longer than a process time of forming the part of the metal layer into the light-shielding layer.

* * * * *